United States Patent [19]

Yazaki

[11] Patent Number: 4,682,277

[45] Date of Patent: Jul. 21, 1987

[54] MOVABLE LIGHT SOURCE TYPE EXPOSURE APPARATUS

[75] Inventor: Yoshio Yazaki, Tokyo, Japan

[73] Assignee: ORC Manufacturing Co., Ltd., Tokyo, Japan

[21] Appl. No.: 884,516

[22] Filed: Jul. 11, 1986

[30] Foreign Application Priority Data

May 24, 1986 [JP] Japan .................................. 61-119899

[51] Int. Cl.$^4$ ........................ F21V 7/00; G03B 27/54
[52] U.S. Cl. ..................................... 362/296; 355/53; 355/67; 355/71; 355/80; 362/303; 362/319
[58] Field of Search ...................... 362/296, 303, 319; 355/67, 71, 80, 53

[56] References Cited

U.S. PATENT DOCUMENTS

| | | | |
|---|---|---|---|
| 3,042,795 | 7/1962 | Kron ................................... | 362/296 |
| 4,172,658 | 10/1979 | Tani ..................................... | 355/71 |
| 4,215,935 | 8/1980 | Loeback ............................... | 355/67 |
| 4,277,166 | 7/1981 | van Boven ........................... | 355/67 |
| 4,348,105 | 9/1982 | Caprari ................................ | 355/67 |
| 4,378,583 | 3/1983 | Caprari ................................ | 362/303 |

Primary Examiner—Douglas Hart
Attorney, Agent, or Firm—Cushman, Darby & Cushman

[57] ABSTRACT

A movable light-source type exposure apparatus comprising a light source disposed at the focal point of a parabolic reflector, a first light-shielding member disposed right beneath the light source and intended to prevent the light rays from the light source from being irradiated directly over a mask and a work, a second light-shielding member disposed closely to the mask and work so as to cause the formation of a shadow capable of equalizing the cumulated amounts of light rays at points thereon, a positioning/fixing means intended, for each exposure, to position and fix a retaining frame for the mask and a retaining frame for the work, and a light-source moving means for moving a lamp house having the parabolic reflector, light source, first light-shielding member and second shielding member over the mask and work for purpose of causing the same to be exposed.

1 Claim, 4 Drawing Figures

MOVABLE LIGHT SOURCE TYPE EXPOSURE APPARATUS

BACKGROUND OF THE INVENTION:

1. Field of the Invention

The present invention relates to a movable light-source type exposure apparatus, which enables an image pattern of an original to be baked with high precision onto a material to be exposed, such as a print board, by use of parallel lights.

2. Description of the Prior Art

A conventional exposure apparatus is arranged such that a point light source is disposed at a focal point of a deep parabolic reflector. A light-shielding member is disposed between the light source and an exposure plane so as to obtain parallel light rays. An original and the material to be exposed are caused, in a state wherein both are cohered together, to move along the exposure plane by use of a conveyor means or the like. Whereby, any point on the material to be exposed is exposed with a specified cumulated amount of light by the shadow produced by the light-shielding member.

In the above-mentioned exposure apparatus, however, since an actual light source is not a point in its true meaning but is of some measurable size, there are produced scattered light rays. For this reason, it was necessary to dispose the light-shielding member at a position closer to the material to be exposed in order to obtain a more precise exposure thereof. For this reason, the light-shielded zone was comparatively small. So that, in order to obtain a required area of exposure, one had to make the light-shielding member large in size and dispose the material to be exposed at a position spaced away from the light source. As a result, the efficiency with which light rays were utilized decreased and necessitated the use of a deep parabolic reflector capable of providing a high light-collecting efficiency.

In the conventional movable type exposure apparatus, the original pattern is not required to be finely baked onto the material to be exposed with high precision. In order to make the apparatus more efficient with respect to productivity as well as to make it easier to construct, the exposure apparatus was arranged such that the light source was fixed and the original and the material to be exposed were moved along the exposure plane in a condition wherein both were cohered to each other.

In recent years, integrated circuits have increased in their degree of integration, in number of pins employed, and in amount of wiring. On the other hand, an integrated circuit which is small in pin interval has more frequently been desired. For this reason, a correspondingly fine print board has also been demanded. Conventional exposure apparatus has, however, failed to provide an exposure precision which meets such requirements. A reason for this is that while the precision with which an original image is positioned relative to a material to be exposed has at present been required to be ±5 microns, the exposure apparatus adapted to transfer the original and the material to be exposed in a state wherein both are cohered together has failed because of mutual displacement therebetween due to vibration at transfer. A second reason is that since the conventional deep parabolic reflector has a short focal point, the parallel light rays are more scattered, as compared with a small-width parabolic reflector of longer focal point, when a light source of same size is used. This causes a decrease in clarity of the image, resulting in a decrease in the exposure precision.

SUMMARY OF THE INVENTION

The object of the present invention is to provide an exposure apparatus which can solve the problems involved in the prior art and is capable of exposure of high precision.

To attain the above object, according to the present invention, there is provided an exposure apparatus of movable light-source type, which comprises a light source disposed at a position corresponding to a focal point of a parabolic, or similar, reflector, a first light-shielding member disposed right beneath the light source and intended to prevent the lights from the light source from being irradiated directly over an original image and a material to be exposed, a second light-shielding member disposed at a position closer to the position of the original image and material to be exposed so as to cause the formation of a shadow capable of making equal the cumulated amounts of lights at points thereon, a positioning/fixing means intended, for each exposure, to position and fix a retaining frame for the original and a retaining frame for the material to be exposed, and a light-source moving means for moving a lamp house having the parabolic, or similar, reflector, light source, first light-shielding member and second light-shielding member over the original and the material to be exposed for purpose of causing the same to be exposed.

The first light-shielding member is provided so as to cause parallel light rays to be obtained. As a result, it is possible to dispose the first light-shielding member of an optimum size at an optimum position close to the position in which the light source is located. This makes it possible to shield over a wide range the light rays being irradiated directly onto the material to be exposed. This makes it possible to dispose the material to be exposed at a position close to the light source. Further, it is possible to dispose the second light-shielding member at a position close to the material to be exposed, in a state wherein it has an optimum shape and minimum required size, said shape and size being capable of permitting a cumulated exposing amount of light to be equally imparted to any portion of the material to be exposed at the time of exposure with the light source being moved. This makes it possible to enlarge an area of exposure. As will be understood, since the material to be exposed is closer to the light source and the area of exposure is made larger, the efficiency with which light rays are utilized becomes high. Further, since the direct irradiation is prevented over a wide range, it becomes possible to use a shallow parabolic reflector of longer focal distance. This makes it possible to reduce the scattered lights and increase the light rays approximate to parallel light rays. This enables an increase in the precision of exposure.

In the present invention, when exposure is performed, the light source is moved in a state wherein the original image is positioned relative to the material to be exposed and is fixed to the same. Therefore, the problem of mutual displacement therebetween is solved. Further, positioning therebetween can be easily effected with high precision to enable exposure to be made with high precision.

DESCRIPTION OF THE PREFERRED EMBODIMENTS

An embodiment of the invention will now be described in detail with reference to the appended drawings.

Figure 1:
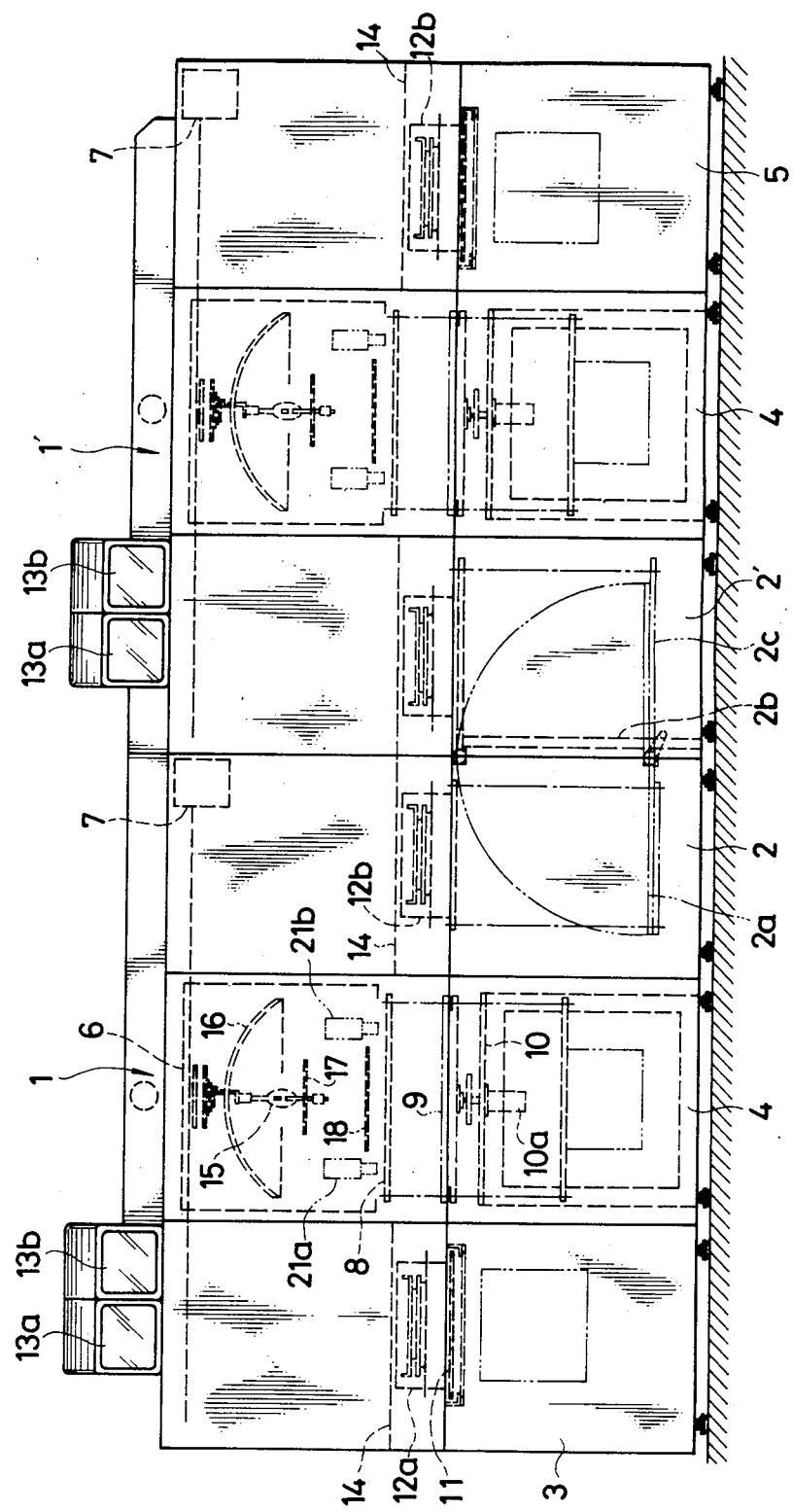
FIG. 1 is a front view of an exposure apparatus of movable light-source type according to an embodiment of the invention.
Figure 2:
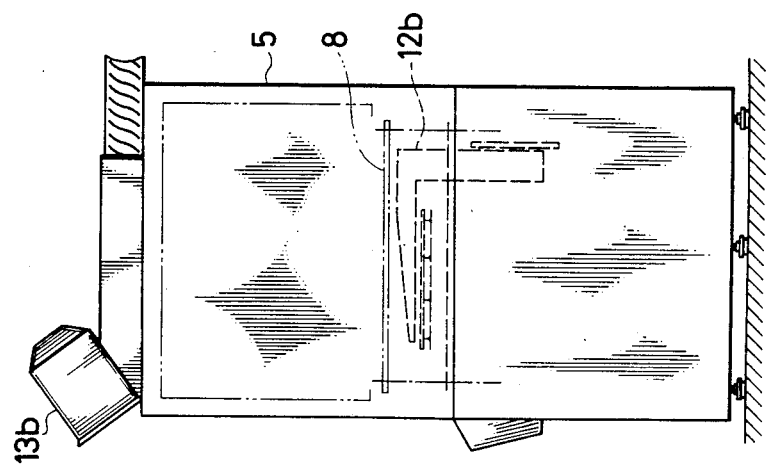
FIG. 2 is a side view of FIG. 1.

FIG. 1 is a front view illustrating a movable light-source type exposure apparatus according to an embodiment of the invention. FIG. 2 is a side view of the exposure apparatus illustrated in FIG. 1. This embodiment uses two movable light-source type exposure apparatuses 1, 1' which are connected to each other by means of flap turn units 2, 2', so as to enable both side surfaces of, for example, a print board to be exposed. The movable light-source type exposure apparatus 1 which is intended to cause a material to be exposed (hereinafter referred to as "work") to have its upper surface processed is composed of a loader 3, an exposer 4 and the flap turn unit 2. The movable light-source type exposure apparatus 1' which is intended to cause the exposure material to have its lower surface processed is composed of the flap turn unit 2', exposer 4 and an unloader 5. In each exposure apparatus 1, 1', a lamp house 6 constituting a parallel-light source as later described is suspended so that it may be movable between a waiting position on the side of the loader 3 and a waiting position of the side of the flap turn unit 2. In a light source movement mechanism 7, a known belt-drive means or ball-screw drive means is used as a means for moving the lamp house. The stoppage of the lamp house is effected by detecting the waiting position by means of a position detector such as a limit switch and stopping the rotation of a drive motor. The exposer 4 is provided with an original (hereinafter referred to as "mask") retaining frame 8 and a work retaining frame 9. When exposure is performed, the mask retaining frame 8 is lowered by a positioning means as later described, whereby a mask is positioned relatively to a work and both are fixed. The work retaining frame 9 is supported by a work stage 10. When one of the mask retaining frame 8 and the work retaining frame 9 is positioned relatively to the other, the work retaining frame 9 is minutely moved upwards by operation of a motor 10a, whereby a non-impact positioning is effected. In order to transfer a work 11 put into the loader 3, a transfer 12a is disposed therein in such a manner as to be movable from the right to the left or vice versa. At the side of the loader 3, the transfer 12a is moved downwards and adsorbs the work 11 by vacuum. Thereafter, the transfer 12a is moved upwards and then moves to a position above the work retaining frame 9 when the mask retaining frame 8 is located at a waiting position (is in a state wherein it is moved upwards.) Then, the transfer 12a is moved downwards to release the work 11. Similarly, after completion of exposure, the work is transferred, by the other transfer 12b, from the work retaining frame 9 to the flap turn unit 2. It is preferable, from the viewpoint of enhancing the efficiency of exposure operation, to cause both the transfers 12a and 12b to operate simultaneously, namely, to effect the carrying-away of the exposed work from the work retaining frame 9 simultaneously with the carrying of a next work into the loader 3. Further, it is preferable, from the viewpoint of desorption and cooling effect, to blow an ionized air when causing the transfers 12a, 12b to adsorb the work 11 by vacuum. In the flap turn unit 2, the work 11 is retained by a work inversion means 2a and then is lowered by an elevator 2b. Then, the work 11 in the lowered position is rotated through an angle of 180°, whereby the work 11 is turned upside down to be set on a work stage 2c on the side of a flap turn unit 2'. Subsequently, the work inversion means 2a is restored to its original position and is caused to rise jointly with the work stage 2c. In the movable light-source type exposure apparatus 1', the back surface of the work 11 is exposed to lights in the same manner as has been described above. Finally, the work 11 is transferred onto a work stage of the unloader 5 and thus awaits being taken out. In each exposure apparatus, there are provided monitoring televisions 13a and 13b which are intended to be used for monitoring the periodic operation of inspecting and correcting a state wherein the mask is positioned relatively to the work. The numeral 14 denotes light shielding plates which are each intended to be used for preventing the work from being exposed to light when it is in the waiting position.

Figure 3:
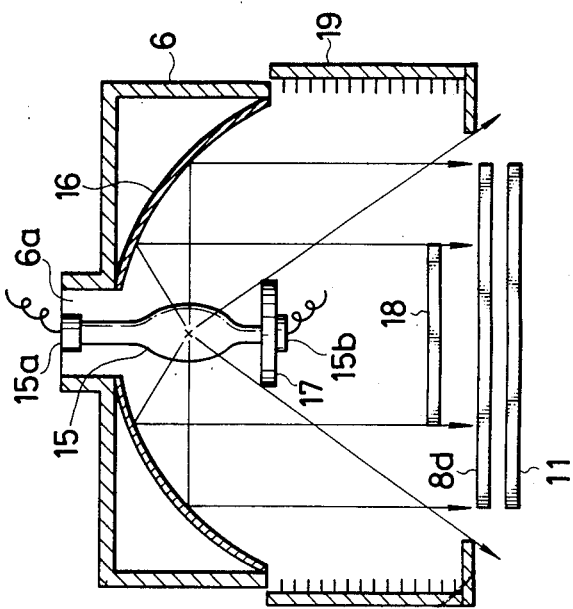
FIG. 3 is a vertically sectional view of an embodiment of the lamp house.

The construction of the lamp house 6 will now be described. FIG. 3 is a vertically sectional view illustrating a lamp house according to an embodiment of the invention. A light source (hereinafter referred to simply as "lamp") 15 is located at the position of a focal point of a parabolic reflector 16. The lamp 15 and reflector 16 are received in the lamp house 6. An upper mouthpiece 15a of the lamp 15 and a lead wire therefor are led outside by way of an opening 6a at the upper end of the parabolic reflector 16. A lower mouthpiece 15b of the lamp 15 and a lead wire therefor are led outside by means of suitable supporting bars together with a first light-shielding member 17 provided right beneath the lamp 15. The opening 6a of the lamp house 6 concurrently serves as an air exhaust port for ventilation and cooling. The first light-shielding member 17 prevents direct lights from being irradiated onto the mask 8d and work 11 and causes only parallel lights to be irradiated onto the same. The surface of the first light-shielding member 17 is coated thereon with a light absorber such as carbon particles so as to prevent the irregular reflection. The resultant increase in temperature is coped with by causing an air to be laterally blown by use of, for example, a fan. In the vicinity of the mask 8d, a second light-shielding member 18 is disposed in a manner to oppose the mask 8d and is supported in the lamp house 6 by means of suitable supporting bars. In this embodiment, since a shallow parabolic reflector is used for making the focal distance longer, it happens that light rays are irradiated outside the exposure zone. In order to prevent those light rays from being scattered, a cylindrical member 19 for shielding and absorbing said light rays is secured to the lamp house 6 at the periphery of the parabolic reflector 16. As a result, only the light rays reflected from the parabolic reflector 16 are irradiated onto the mask 8d and the work 11. Further, since the parabolic reflector has a longer focal distance than in the prior art, it is possible to make the light rays from the light source substantially parallel ones. This makes small the decrease in clearness of the image due to the effect of the scattered light rays. Another advantage which is obtained from the use of the shallow parabolic reflector 16 is that the illumination distribution is smaller in variation than in the prior art and this makes it possible to utilize a wider area of exposure. At the same time, not only measurement of the cumulated amount of light but also cumulation of light becomes easy, so that the degree of uniformity with which light is cumulated at each point in the exposure plane can be increased. The second light-shielding member 18 acts to cause a shadow to be produced when exposure is made of the mask 8d and work 11 positioned and fixed in the path of movement of parallel light rays, thereby limiting the exposure area so as to permit the cumulated amount of light at any given point in the exposure plane to have a specified value. To this end, the shape of the second light-shielding member 18 is adjusted and determined by calculating the cumulated amount of light or by measuring it by means of cumulated-light-amount measuring devices disposed at specified points. In this embodiment, the configuration of the second light-shielding member 18 is shaped like a boat. Since any one of the first 17 and the second light-shielding member 18 performs its peculiar independent function, its position and shape can be determined to optimum ones by designing or adjusting without being affected by the function of the other member.

Figure 4:
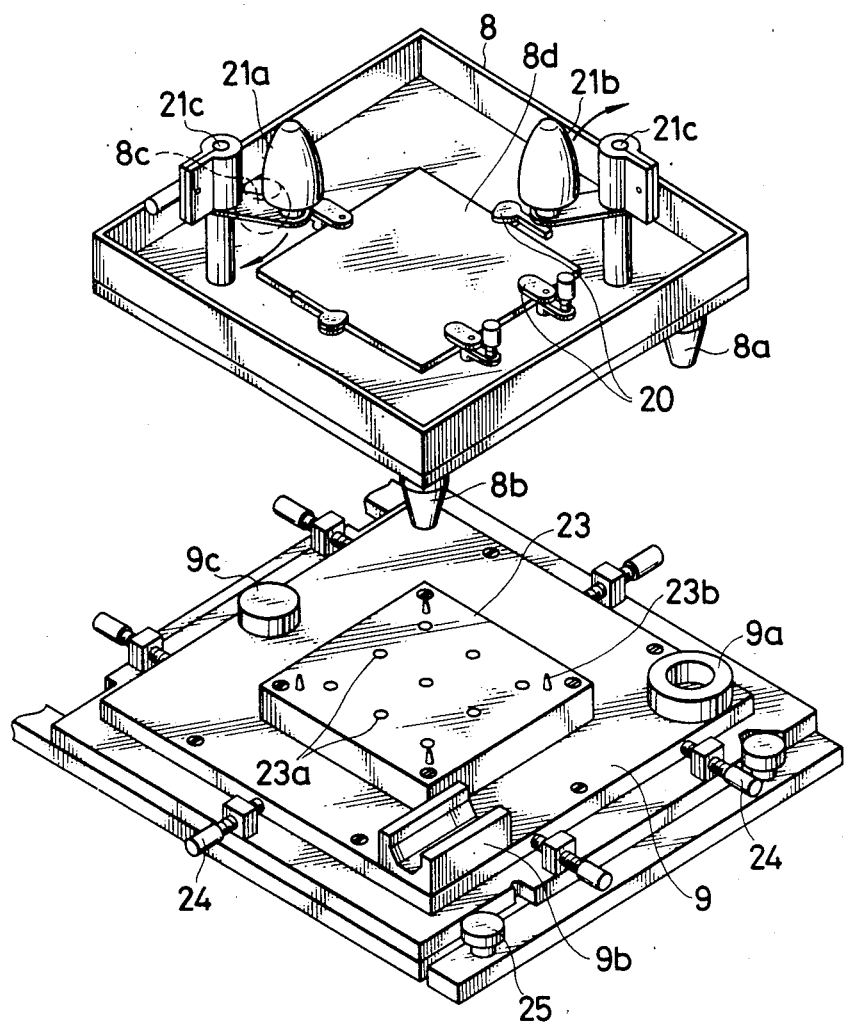
FIG. 4 is a perspective view of an embodiment of the positioning means for a mask and a work.

The construction of the positioning means for mask and work will now be described. FIG. 4 is a perspective view of an essential part of the positioning means according to an embodiment of the invention. The mask 8d consists of a film or a photographic glass plate. It is fixed to a specified position of the mask retaining frame (hereinafter referred to simply as "upper frame") 8 by a retaining means 20. On the upper surface of the upper frame 8, a video camera 21a for the monitoring television 13a and a video camera 21b for the monitoring television 13b are also disposed in a manner that they are rotatable about rotary shafts 21c, 21c, respectively. When the lamp house is moved for exposure, the video cameras 21a, 21b are automatically retreated in arrow-indicated directions, respectively, so as not to become obstacles. On the underside of the mask retaining frame 8 there is provided a means for determining the positional relation between the upper frame and the work retaining frame (hereinafter referred to as "lower frame"), said means being constituted by protrusions 8a, 8b each consisting of a frustum of cone, and a protrusion 8c having a spherical end portion. The positional relation between these three protrusions 8a, 8b and 8c is such that the protrusion 8c is disposed at a position spaced at an equal distance from respective centers of the protrusions 8a and 8b. More specifically, the protrusions 8a, 8b and 8c are disposed at the corner points of an isosceles triangle the base of which is a line portion between the protrusions 8a and 8b and the vertex of which is the center of the protrusion 8c. On the upper surface of the lower frame 9, receiving members 9a, 9b and 9c are disposed at positions corresponding to the protrusions 8a, 8b and 8c of the upper frame 8. That is to say, the cylindrical thick-walled receiving member 9a is provided in corresponding relation to the frusto-conical protrusion 8a, the receiving member 9b shaped like a substantially C-shaped groove is provided in corresponding relation to the frusto-conical protrusion 8b, and the cylindrical solid receiving member 9c having a flat upper surface is provided in corresponding relation to the protrusion 8c shaped like a spherical body. An adsorbing base seat 23 is provided on the lower frame 9 correspondingly to the mask 8d fixed to the upper frame 8. The adsorbing base seat 23 consists of steel of that alloy called "IMBA" which contains 36% of nickel and which is low in thermal expansion. The adsorbing base seat 23 is formed with small holes 23a for vacuum suction and is provided, at its four corners, with those position regulators 23b each consisting of a taper pin which are intended for positioning the material to be exposed, respectively. Positioning of the lower frame 9 is performed by operation of minutely lower-frame adjusting means 24 while viewing the monitoring television. The lower frame 9 as a whole is pressed, by pressing members not shown, against lower-frame fixing members 25 and, in this state, is positioned and fixed in the exposer 4 of FIG. 1. On the other hand, the upper frame 8 is disposed in the exposer 4 in a manner that it is vertically movable by a known drive means such as that based on the use of a motor, belt, or the like. With the above-mentioned construction, when exposure is made, the upper frame 8 and the lower frame 9 have their positions fixed by supporting of the protrusions 8a, 8b and 8c at three points, i.e., the receiving members 9a, 9b and 9c. The positional relation between the upper frame 8 and the lower frame 9 which is determined with the use of those three points is one in number. In consequence, it is possible to effect a positioning of the mask and work with high reproducibility as well as a high precision of approximately ±5 microns.

The present invention is not limited to the above-mentioned embodiments but permits various modifications to be made without departing from the spirit and scope of the invention. For example, the positioning means is not limited to the above-mentioned embodiment but may be constituted by a three-point supporting mechanism using taper pins or the like. Further, the work constituting a material to be exposed may be also handled not by the transfer but by a robot or belt. Further, the exposure apparatus may of course be also used as a single-side exposure apparatus. The reflector which is employed in the present invention may be one which is similar to the parabolic reflector.

As has been described above, according to the present invention, since substantially parallel light rays are obtained, it is possible to lessen the decrease in clearness of the image which would occur due to the action of the scattered light rays. Further, since the mask and work are fixed at the time of exposure, their positioning can be effected with high precision without being affected by the vibrations which would occur in their being transferred in the prior art. Thus, according to the present invention, it is possible to effect a highly precise exposure and baking which would be impossible with the conventional exposure apparatus. Further, since the light source is moved for exposure, the exposure apparatus of the present invention has an excellent heat-radiating effect.

What is claimed is:

1. An exposure apparatus of movable light-source type, comprising a light source disposed at a position corresponding to a focal point of a substantially parabolic, reflector, a first light-shielding member disposed right beneath said light source and intended to prevent the light rays from said light source from being irradiated directly over an original image and a material to be exposed, a second light-shielding member disposed at a position closer to the position of said original image and material to be exposed so as to cause the formation of a shadow capable of making equal the cumulated amounts of light rays at points thereon, a positioning/fixing means intended, for each exposure, to position and fix a retaining frame for said original and a retaining frame for said material to be exposed, and a light-source moving means for moving a lamp housing having said substantially parabolic reflector, light source, first light-shielding member and second light-shielding member over said original and said material to be exposed for purpose of causing the material to be exposed.

* * * * *